United States Patent [19]
Anders et al.

[11] Patent Number: 5,827,580
[45] Date of Patent: Oct. 27, 1998

[54] LOW TEMPERATURE FORMATION OF ELECTRODE HAVING ELECTRICALLY CONDUCTIVE METAL OXIDE SURFACE

[75] Inventors: Simone Anders; Andre Anders, both of Albany; Ian G. Brown, Berkeley; Frank R. McLarnon, Orinda; Fanping Kong, Berkeley, all of Calif.

[73] Assignee: Regents of The University of California, Oakland, Calif.

[21] Appl. No.: 625,270

[22] Filed: Mar. 27, 1996

[51] Int. Cl.⁶ .................................................. H01T 14/00
[52] U.S. Cl. .................... 427/580; 427/126.3; 427/255.3
[58] Field of Search ................................ 427/580, 126.3, 427/255.3

[56] References Cited

U.S. PATENT DOCUMENTS 5,443,711  8/1995  Kojima et al. ........................ 427/126.3
5,470,668  11/1995  Wu et al. ................................. 428/688

OTHER PUBLICATIONS

Anders, S., et al., "Formation of Metal Oxides by Cathodic Arc Deposition", *International Conference on Metallurgical Coatings and Thin Films: Program and Abstracts*, Apr. 24–28, 1995, p. 103.

Anders, S., et al., "Formation of Metal Oxides by Cathodic Arc Deposition", *Surface & Coatings Technology*, vol. 76–77, (Nov.) 1995, pp. 167–173.

Anders, S., et al., "Copper Oxide Films Formed by Reactive Cathodic Arc Deposition", *21st IEEE International Conference on Plasma Science*, Jun. 6–8, 1994, One page—Abstract.

"Atraverda", Atraverda Limited, Sheffield, England, Apr. 1, 1994, pp. 1–4.

Atraverda Limited, "Applications of Ebonex™ Electrode Materials in Environmental Processes", *Electrochemical Processing—Innovation and Progress*, Glasgow, Apr. 21–23, 1993, pp. 1–18.

MacGill, R.A., et al., "Cathodic Arc Deposition of Copper Oxide Thin Films", (published in *Surface and Coatings Technology*, 78, No. 1–3, Jan., 1996, pp. 168–172), pp. 1–14.

*Primary Examiner*—Bernard Pianalto
*Attorney, Agent, or Firm*—John P. Taylor; Paul R. Martin

[57] ABSTRACT

A low temperature process is disclosed for forming metal suboxides on substrates by cathodic arc deposition by either controlling the pressure of the oxygen present in the deposition chamber, or by controlling the density of the metal flux, or by a combination of such adjustments, to thereby control the ratio of oxide to metal in the deposited metal suboxide coating. The density of the metal flux may, in turn, be adjusted by controlling the discharge current of the arc, by adjusting the pulse length (duration of on cycle) of the arc, and by adjusting the frequency of the arc, or any combination of these parameters. In a preferred embodiment, a low temperature process is disclosed for forming an electrically conductive metal suboxide, such as, for example, an electrically conductive suboxide of titanium, on an electrode surface, such as the surface of a nickel oxide electrode, by such cathodic arc deposition and control of the deposition parameters. In the preferred embodiment, the process results in a titanium suboxide-coated nickel oxide electrode exhibiting reduced parasitic evolution of oxygen during charging of a cell made using such an electrode as the positive electrode, as well as exhibiting high oxygen overpotential, resulting in suppression of oxygen evolution at the electrode at full charge of the cell.

19 Claims, 3 Drawing Sheets

LOW TEMPERATURE FORMATION OF ELECTRODE HAVING ELECTRICALLY CONDUCTIVE METAL OXIDE SURFACE

BACKGROUND OF THE INVENTION

The invention described herein arose in the course of, or under, Contract No. DE-AC03-SF00098 between the United States Department of Energy and the University of California for the operation of the Ernest Orlando Lawrence Berkeley National Laboratory. The Government may have rights to the invention.

1. Field of the Invention

This invention relates to a low temperature method of making an electrode with an electrically conductive metal oxide surface. In a particularly preferred embodiment, this invention relates to the low temperature formation of an electrically conductive metal oxide coating on an electrode used in a rechargeable cell.

2. Description of the Related Art

In rechargeable cells such, for example a nickel cadmium cell, parasitic evolution of oxygen can occur during charging of the cell. Overcharging of the cell also results in oxygen evolution (and resulting gas pressure buildup in a sealed cell) after the positive electrode, e.g., after the nickel oxide electrode is fully charged. It would be beneficial to provide a coating over the electrode which would suppress either type of undesirable oxygen evolution.

It may be also desirable to use, as an electrode material, a substance or compound having very little intrinsic electrocatalytic activity. In some instance it would be useful to coat the electrode with a material which also exhibits good corrosion resistance, particularly corrosion by cathodically generated hydrogen or oxygen, although the conventional nickel oxide electrodes used in nickel cadmium cells possess satisfactory corrosion resistance.

While at least some of these properties are exhibited by some metal oxides, such materials are usually insulators rather than conductors, which would result in high cell resistance if such an insulative material was used as a coating on one or both of the electrodes of a rechargeable cell.

Recently materials comprising suboxides of titanium have become commercially available which exhibit very high electrical conductivity compared to most metal oxides. In a paper entitled "Applications of Ebonex™ Electrode Materials In Environmental Processes" presented during Electrochemical Processing—Innovation and Progress, Moat House International, Glasgow, on Apr. 23, 1993, a resistivity as low as $6.3 \times 10^{-4} \Omega$cm. was reported for a titanium suboxide ($Ti_4O_7$). In the same paper, the authors showed a graph plotting the percentage of oxide in various titanium oxides plotted against conductivity. This graph showed a decline in conductivity as oxide content rose, until the oxide content exceeded about 1.7. Furthermore, such suboxides of titanium have been found to have high oxygen overpotential, thus acting as inhibitors of undesirable oxygen evolution at the electrode surface.

However, such titanium suboxides are conventionally formed by reducing titanium dioxide ($TiO_2$) with hydrogen at temperatures of 1000° C. or higher. In the case of many electrode materials, e.g., a nickel oxide electrode utilized in a nickel cadmium cell, exposure of the electrode to a temperature in excess of about 500° C. to apply such a titanium suboxide coating would result in the formation of electrochemically inert species.

Recently several of us (S. Anders, A. Anders, and I. G. Brown) published an article with others entitled "Cathodic Arc Deposition of Copper Oxide Thin Films", by R. A. MacGill et al., in Surface and Coatings Technology 78, No. 1–3, Jan. 1996, pp. 168–172, relating to the deposition of copper oxide films by cathodic arc deposition, a low temperature deposition process in which a solid copper cathode is used to produce a plasma which then reacts with oxygen gas admitted into the plasma chamber. A copper oxide film then deposits on a substrate, which may be pulse biased.

SUMMARY OF THE INVENTION

It has now been discovered that metal suboxides can be formed on substrates by a low temperature cathodic arc deposition by either controlling the pressure of the oxygen present in the deposition chamber, or by controlling the density of the metal flux, or by a combination of such adjustments, to thereby control the ratio of oxide to metal in the deposited metal suboxide coating. The density of the metal flux may, in turn, be adjusted by controlling the discharge current of the arc, by adjusting the pulse length (duration of on cycle) of the arc, and by adjusting the repetition rate of the arc, or by any combination of these parameters.

In a preferred embodiment, an electrically conductive metal suboxide, such as, for example, an electrically conductive suboxide of titanium, can be deposited at low temperatures on the surface of an electrode. In a particularly preferred embodiment, this conductive suboxide coating can be formed on the surface of a nickel oxide electrode used in a rechargeable cell, by such cathodic arc deposition and control of the deposition parameters. The resulting titanium suboxide-coated nickel oxide electrode exhibits reduced parasitic evolution of oxygen during charging of a cell made using such an electrode as the positive electrode. The titanium suboxide-coated electrode, when used as the positive electrode in a cell, also exhibits high oxygen overpotential resulting in suppression of oxygen evolution at the electrode at full charge of the cell.

BRIEF DESCRIPTION OF THE DRAWINGS

FIG. 3 is a schematic showing one way in which the components of the cathode arc deposition apparatus may be electrically connected together and to the power supply.

DETAILED DESCRIPTION OF THE INVENTION

Figure 1:
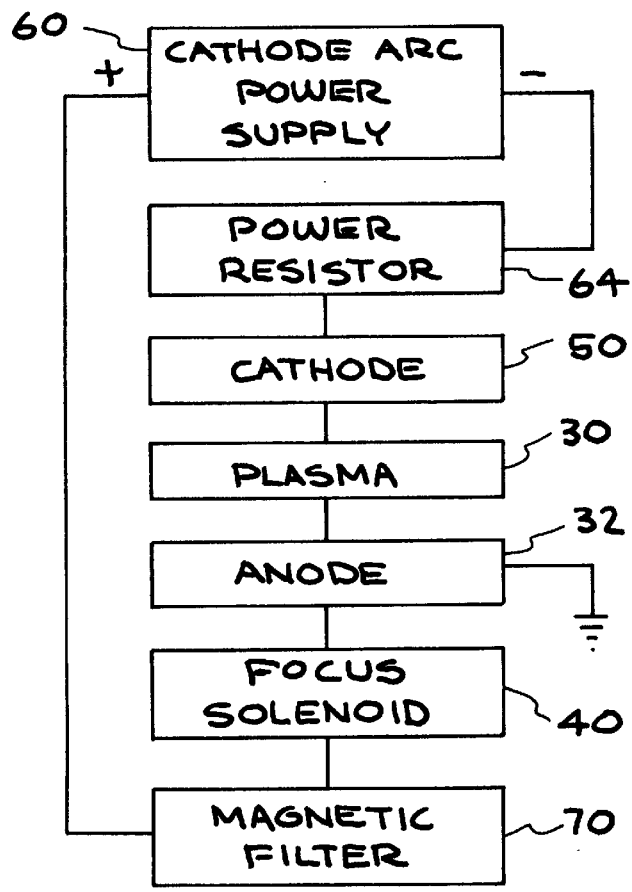
FIG. 1 is a flowsheet illustrating a preferred embodiment of the process of the invention.

The invention comprises a low temperature process for forming metal suboxides on substrates by cathodic arc deposition by either controlling the pressure of the oxygen present in the deposition chamber, or by controlling the density of the metal flux, or by a combination of such adjustments, to thereby control the ratio of oxide to metal in the deposited metal suboxide coating. The density of the metal flux may, in turn, be adjusted by controlling the discharge current of the arc, by adjusting the pulse length (duration of on cycle) of the arc, and by adjusting the frequency of the arc, or any combination of these parameters. In a preferred embodiment, the invention comprises a low temperature process for forming an electrically conductive metal suboxide, such as, for example, an electrically conductive suboxide of titanium, on an electrode surface, such as the surface of a nickel oxide electrode, by such cathodic arc deposition and control of the deposition parameters. In the preferred embodiment, the process results in a titanium suboxide-coated nickel oxide electrode exhibiting reduced parasitic evolution of oxygen during charging of a cell made using such an electrode as the positive electrode, as well as exhibiting high oxygen overpotential, resulting in suppression of oxygen evolution at the electrode at full charge of the cell. However, the low temperature formation of an electrically conductive metal oxide surface, in accordance with the invention, may be utilized in the formation of other electrodes as well.

a. Definitions

The use of the term "low temperature" herein, as relating to the substrate temperature at which the metal suboxides can be formed by cathodic arc deposition, is intended to describe a temperature ranging from about room temperature (~20° C.–25° C.) to about 100° C., although temperatures below room temperature, e.g., as low as 0° C., could be used if desired, and should be deemed to be within the definition of "low temperature", as used herein.

The use of the term "metal suboxide" herein is intended to define an oxide of a metal which will not form, by cathodic arc deposition, when an excess of oxygen gas is present during the deposition, as opposed to the normal stoichiometric metal oxide compound which forms in the presence of an excess of oxygen, e.g., $TiO_2$.

The use of the term "conductive metal suboxide" herein is intended to define a metal suboxide generally having a resistivity between about $10^{-5}$ Ωcm and about 1 Ωcm, although it is not the intent to exclude from the definition metal oxides having a resistivity lower than $10^{-5}$ Ωcm.

The use of the term "high oxygen overpotential" herein is intended to define an oxygen-evolution potential of at least 700 millivolts with respect to a reference Hg/HgO electrode.

The use of the term "conductive titanium suboxide" herein is intended to define an oxide of titanium having the formula $TiO_x$, where x ranges from at least 1.6 to about 1.9, and preferably from at least 1.7 to about 1.8.

b. The Cathodic Arc Deposition Apparatus

Figure 2:
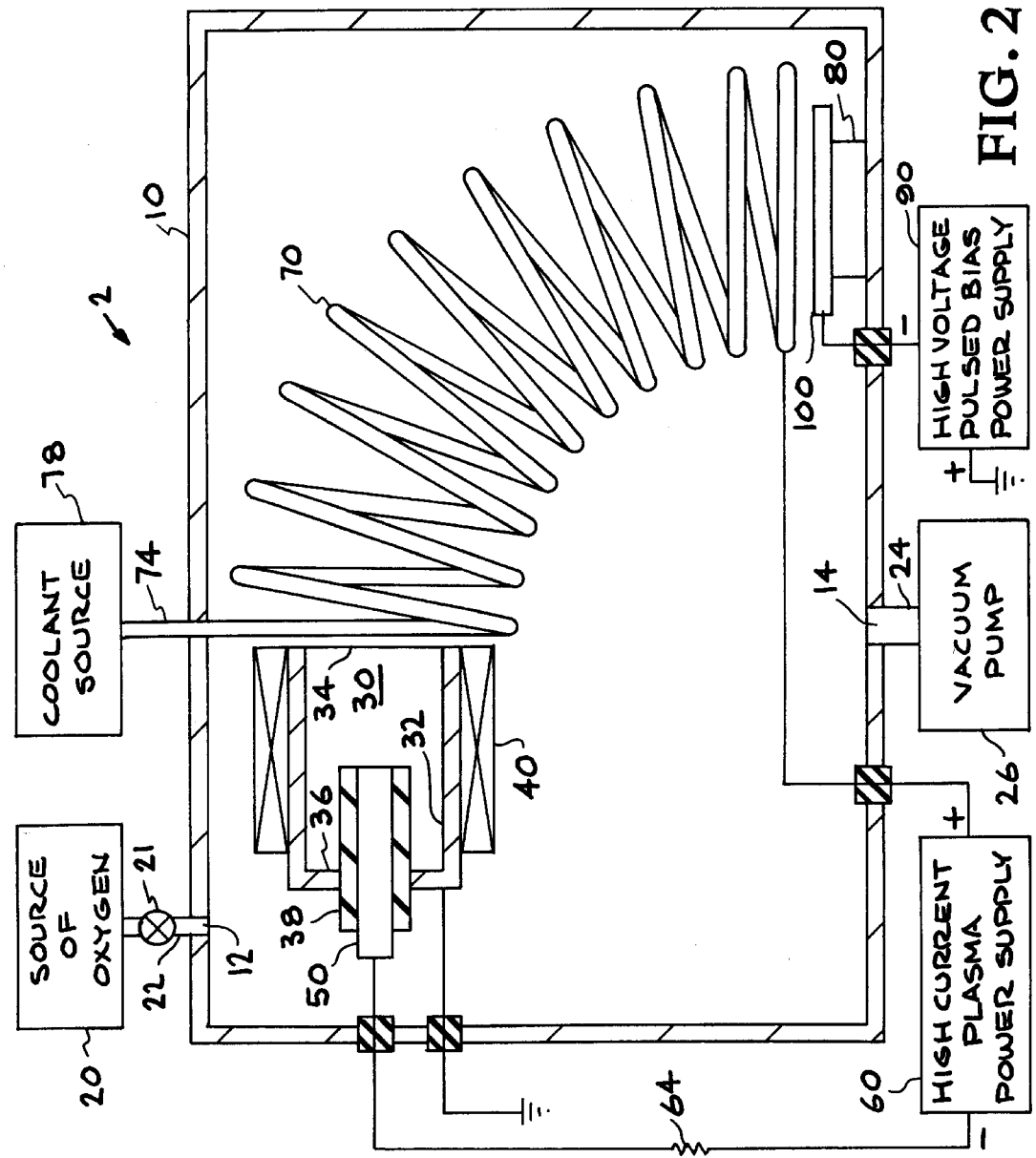
FIG. 2 is a vertical side section view of a typical cathode arc apparatus in which the process of the invention may be practiced.

Turning now to FIG. 2, a typical cathodic arc deposition apparatus suitable for use in the process of the invention is generally illustrated at 2 comprising a sealed deposition chamber 10 having an inlet port 12 connected, via valve 21 and line 22, to a gaseous source of oxygen 20, and an exit port 14 connected, via a line 24, to a vacuum pump 26 to thereby maintain an oxygen atmosphere in deposition chamber 10.

Within deposition chamber 10 is a plasma chamber 30 which, in the illustrated embodiment, may comprise a grounded cylindrical metal anode 32 having an open end at 34, although grounding of anode 32 is optional. Surrounding the cylindrical wall of anode 32 is a focus solenoid 40 which serves to contain and focus the plasma to be generated within plasma chamber 30. Cylindrical anode 32 has a closed end 36 in which is mounted a cylindrical insulator 38 which surrounds a cylindrical metal cathode 50 which is formed of the metal to be ionized in the plasma to react with the oxygen gas to form the desired metal suboxide.

Cathode 50 is connected through a high-wattage low-resistance power resistor 64 to the negative terminal of a high current pulsed power supply 60 which supplies the energy for the plasma. The positive terminal of power supply 60, in the illustrated embodiment, is shown connected to one end of a coil 70 of hollow metal tubing which extends from open end 34 of plasma chamber 30 to a substrate platform 80 on which rests a substrate 100 which will be coated with the reaction product of the metal ions in the plasma and the oxygen atoms. Coil 70 is shown formed with a 90° bend between plasma chamber 30 and substrate platform 80 to enable coil 70 to serve as a magnetic particle filter, as will be explained below. A coolant from a coolant source 78 is shown connected to coil 70 via lines 74 to enable coolant to flow through coil 70 to inhibit generation of excess heat in deposition chamber 10. Substrate 100, in the illustrated embodiment, is shown connected to the negative terminal of a grounded high voltage bias power supply 90.

As shown in FIG. 3, in the illustrated embodiment, power resistor 64, cathode 50, anode 32, focus solenoid 40, and magnetic filter coil 70 may be connected in series across power supply 60. It will be understood that focus solenoid 40 and magnetic filter coil 70 could each be independently powered by their own power supply, if desired, and that power supply 60 could be a very high current non-pulsed power supply connected directly (or through resistor 64) to anode 32 and cathode 50. However, since the illustrated embodiment is shown operating as a pulsed source, it is convenient to use the same power supply for the plasma generation as well as for focus solenoid 40 and for magnetic particle filter 70 to provide inherent synchronization of the operation of these components with the energization of the plasma arc.

The magnetic filter formed by electromagnetic coil 70 acts to bend the plasma beam of metal ions emerging from open end 34 of plasma chamber 30 to direct the beam of metal ions toward substrate 100. However, larger metal particles in the beam (submicron in size) which also emanate from the metal cathode and which are not desirable for the formation of the metal suboxide coating on the substrate, are not bent by the magnetic flux from electromagnetic coil 70 and tend to continue straight through the individual metal coils of coil 70, eventually passing through the openings between the metal coils instead of bombarding the substrate surface.

It should be noted that the illustrated magnetic filter formed by metal coil 70 is not the only way one could construct such a magnetic particle filter. A curved tube, surrounded by solenoid coils, could be used instead, with the inner surface of the curved tube preferably not smooth to thereby inhibit reflection of the metal particles off the inner surface of the curved tube. A metal bellows has been used as the curved tube to prevent such undesired reflection of the metal particles which impact the walls of the metal bellows, with solenoid coils then formed around the metal bellows to generate the magnetic field. It is also possible to use filters which are bent more or less than 90°, straight filters, or no filter at all.

A cathodic arc apparatus similar to that just described, and useful in the practice of the process of this invention, is described in a publication entitled "Macroparticle-free Thin Films Produced by an Efficient Vacuum Arc Deposition Technique", by some of us (S. Anders, A. Anders, and I. Brown), published in the Journal of Applied Physics 74 (6), on 15 Sep. 1993, at pages 4239–4241, the description of which is hereby incorporated by reference; and in a publication entitled "Transport of Vacuum Arc Plasmas Through Magnetic Macroparticle Filters", by some of us (S. Anders, A. Anders, and I. Brown), published in Plasma Sources Science Technology 4 (1995), at pages 1–12, the description of which is also hereby incorporated by reference.

c. Process Parameters

The cathode arc deposition process of the invention is normally carried out at a substrate temperature ranging from about 0° C., and preferably from about room temperature (~20°–25° C.) to about 100° C. A deposition temperature lower than 0° C. is not desirable since lower deposition temperatures can result in undesirable water vapor condensation within the deposition chamber unless high vacuum conditions are maintained within the chamber. Deposition temperatures in excess of 100° C. should be avoided when deposition of amorphous metal suboxide is desired, as in the preferred embodiment of the invention. However, when crystalline metal suboxide is desired, higher deposition temperatures can be used, up to the normal annealing temperature of the particular metal suboxide. Usually, however, deposition temperatures exceeding 100° C. will be avoided for the additional reasons of process economics as well as ease in handling of the coated substrate.

The process of the invention is carried out in the presence of a source of oxygen. While such a source of oxygen may, in its simplest form, merely comprise $O_2$, the desired source of oxygen may also be supplied to the deposition chamber by using one or more other oxygen-containing gases capable of decomposing to supply the desired oxygen. Such oxygen-containing gases may be used instead of $O_2$, or in combination therewith, providing that such oxygen-containing gas or gases do not contain other components or decomposition products which would be harmfull to the desired metal suboxide deposition. $O_3$ and $H_2O_2$ comprise examples of oxygen-containing gases which may be used instead of (or in combination with) $O_2$ gas to maintain the desired oxygen partial pressure in the deposition chamber. The term "oxygen-containing gases", as used herein, will, therefore, include $O_2$ as well as other oxygen-containing gases falling within the above requisites.

The partial pressure of oxygen at which the oxygen-containing atmosphere is maintained in the deposition chamber will range from about 1 Pascal to about 3 Pascals, depending upon the concentration of the metal ions in the plasma. An oxygen partial pressure lower than about 1 Pascal is not desirable because the metal oxide formed in such a reaction may not contain sufficient oxygen to form the desired electrically conducting form of metal oxide, while a deposition pressure in excess of about 3 Pascals is undesirable because the oxygen content of the metal oxide can be too high. The desired oxygen partial pressure in the deposition chamber may be maintained, in its simplest form, by a controlled flow of oxygen ($O_2$) gas into the deposition chamber.

The amount of flow of other oxygen-containing gas or gases into the deposition chamber to maintain the deposition chamber within the above-discussed oxygen partial pressure range above will be dependent upon the volume of the deposition chamber, the amount of leakage in the chamber, and the capacity of the vacuum pump. Since the formation of suboxides functions at least in part based on a starvation of oxygen available to react with the metal ions in the plasma during the deposition, the flow of oxygen-containing gases needed to maintain the deposition chamber within the desired oxygen partial pressure range will also depend on the depletion or reaction rate of the oxygen in the chamber which will, in turn, depend upon the density of the metal ions in the plasma, the area of the substrate on which the metal suboxide is being deposited, the valence of the metal which is reacting with the oxygen gas to form the suboxide, and the molar ratio of the oxide to the metal of the particular suboxide which it is desired to form.

The exact flow of oxygen-containing gases into the deposition chamber to maintain the desired pressure in the chamber may be determined empirically for a given chamber volume, leakage rate, metal ion density, a given substrate area, a given metal valence, and a given desired ratio of metal to oxide (metal suboxide atomic formula).

The cathode arc which generates the plasma may be a steady arc. However, as illustrated, it may also comprise a pulsed arc plasma generator having a duty cycle (duration of pulse) which may range from 2 to 20 milliseconds (ms), and preferably about 2–10 ms, and an off cycle period which may range from about 450 ms to about 550 ms, resulting in a frequency of about 2 pulses per second (Hz). Longer duty cycles and/or higher frequencies (shorter off times) up to and including a constant arc may be used. However, such would require very high current flows, since a discharge current of about 100–300 Amps is required to operate the arc. Such high current flows will result in excessive heat generation, and have been found to be unnecessary. Shorter duty cycles and/or lower frequencies, however, may result in an insufficient plasma generation.

The spacing of the substrate on which the metal suboxide forms will also affect the deposition. Typically the spacing of the substrate from the end of the magnetic filter will vary from about 2 cm. to about 10 cm. Mounting the substrate too close to the magnetic filter should be avoided because of film non-uniformities at small distances, while mounting the substrate too far from the magnetic filter will result in a very low deposition rate.

In a preferred embodiment, either the cathode or the anode will be grounded and the substrate on which the metal suboxide will be deposited is then negatively pulse biased with respect to ground at a bias potential of from about 1–5 kV, preferably about 2–3 kV, with a pulse duration of about 1–3 microseconds ($\mu s$), preferably about 2 $\mu s$, and a pulse off-time of about 5–7 $\mu s$, preferably about 6 $\mu s$, resulting in a pulse frequency of about 100–165 kHz, preferably about 125 kHz. The application of a bias voltage to the substrate enhances the flow of the plasma to the substrate, while the use of a pulsed bias inhibits formation of cathode spots and resulting arcing on the substrate.

The deposition time will be dependent upon the desired thickness of the metal suboxide being deposited, as well as the cathode arc parameters just discussed above, as well as the area of the substrate being coated. A typical deposition time to provide an average metal suboxide coating thickness of about 200 nanometers (nm) of, for example, titanium suboxide on a 1 $cm^2$ substrate at a cathode arc current intensity of 200–300 Amps, a duty cycle (on-time) of about 5 milliseconds, and a pulse of about 2 Hz, with a substrate bias of about −2 kV, a bias pulse duration of about 2 $\mu s$ and pulse off-time of 6 $\mu s$ (125 kHz), will be about 10 minutes.

It should be noted that for the general formation of an electrode having an electrically conductive metal oxide protective film formed thereon by the low temperature process of the invention, the minimum thickness of the electrically conductive metal oxide protective film will be governed by the desired application, e.g., the degree of chemical inertness desired, while the maximum thickness is only limited by process economics, with thicknesses of 1–2 microns or even higher being feasible. However, as will be discussed below, when the electrically conductive metal oxide protective film is being formed over an electrode of a rechargeable cell, there will be more limited minimum and maximum thicknesses of the protective metal oxide film to ensure proper functioning of the underlying rechargeable electrode material.

d. Description of Process Parameters for Preferred Embodiment

In the preferred embodiment there is preferably deposited over a nickel oxide electrode from about 0.5 nm to about 5 nm of an electrically conductive suboxide of titanium, having the formula $TiO_x$, where x ranges from at least 1.6 to about 1.9, and preferably from at least 1.7 to about 1.8. To deposit such a titanium suboxide film within this ratio of titanium to oxygen, the partial pressure of oxygen in the deposition chamber, on a per liter of chamber volume basis and per $cm^2$ of substrate area, will normally range from about 1 Pascal to about 3 Pascals, the pulse length of the pulsed power supply will range from about 2 milliseconds (ms) to about 20 ms in length, the pulse frequency will range from about 1 Hz to about 3 Hz, and the substrate will be biased, with respect to either a grounded or a grounded anode, at about −2 kV at a frequency of about 125 kHz. The temperature at which the conductive suboxide of titanium is deposited will preferably range from about 20° C. to about 100° C.

e. Example

To further illustrate the shift of the oxygen overpotential in a nickel oxide electrode having an electrically conductive titanium oxide film formed thereon at low temperature in accordance with the invention, a titanium suboxide film, having an atomic ratio of titanium to oxygen of about 1:1.85 ($TiO_{85}$), was deposited to a thickness of about 200 nm over a nickel oxide electrode (a nickel electrode comprising a sintered mixture of nickel and nickel oxide particles). During the deposition, the oxygen atmosphere was maintained at a pressure of 1–2 Pa in the deposition chamber and the temperature of the nickel oxide electrode substrate was maintained at about 30° C. To ignite and maintain a plasma between the anode and the titanium cathode, a current of about 200 amps was passed between the grounded anode and the cathode for a pulse duration of 5 milliseconds from a 250 volt capacitive discharge power supply with an off-time of 495 milliseconds (2 Hz frequency). A pulsed bias voltage of about −2 kV was applied to the nickel oxide substrate from a high voltage grounded power supply at a pulse duration of 2 μs and a pulse off time of 6 μs, i.e., a frequency of about 125 kHz. The resultant titanium suboxide-coated nickel oxide electrode formed by the process of the invention was then tested as an electrode in a cell with a reference Hg/HgO electrode, to determine the oxygen overpotential of the resulting titanium suboxide-coated electrode.

Figure 4:
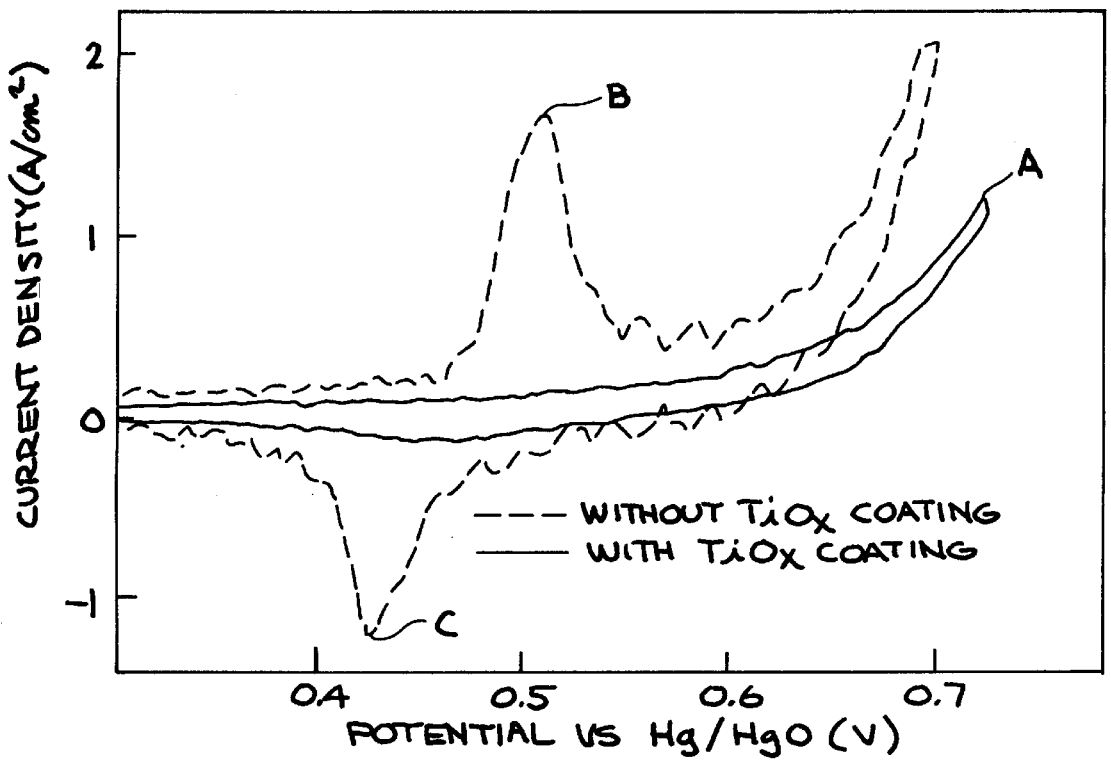
FIG. 4 is a graph showing the overpotential voltage versus current density (oxygen evolution) of a titanium suboxide-coated nickel/nickel oxide electrode formed in accordance with the invention in contrast to a conventional nickel oxide electrode.

As shown by the solid lines in FIG. 4, the electrode constructed in accordance with the invention versus a reference Hg/HgO electrode exhibited at-an oxygen overpotential of about 700 millivolts, as shown by the rise in current at point A, indicating the commencement of significant oxygen evolution at that voltage. Note, in contrast, the dotted line curve which represents the overpotential voltage versus current density for a conventional charged nickel oxide electrode without the titanium suboxide coating thereon. Point B on this dotted line curve represents the fully charged state of the conventional electrode where the $Ni(OH)_2$ is converted to NiOOH, whereas point C represents the conversion of the NiOOH back to $Ni(OH)_2$ during the discharge cycle. Such a conventional electrode already shows a higher current density (more oxygen evolution) than the electrode of the invention at an overpotential voltage of less than 650 millivolts. It should be noted here that the increased oxygen overpotential realized by the titanium suboxide-coated nickel oxide electrode formed by the process of the invention makes it theoretically feasible to charge at least a portion of the nickel oxide electrode material to an even higher oxide state because of the reduced oxygen evolution resulting from the presence of the titanium suboxide coating on the surface of the nickel oxide electrode. Thus, at least some of the $Ni(OH)_2$ may oxidize beyond the normal NiOOH charged state to higher valence state nickel compounds, thereby resulting in a possible increased capacity of the overall nickel oxide electrode to accept charge without any corresponding increase in weight.

It should be noted the above example is only meant to illustrate the shift in oxygen-evolution potential possible using the electrically conductive titanium oxide coating over the electrode, it being understood that a thinner coating would be used in actual operation of the rechargeable cell, as discussed above. It will also be understood that it may be desirable to first treat the underlying rechargeable electrode material before applying the protective layer of electrically conductive, but chemically non-reactive, metal oxide over the rechargeable electrode material, e.g., hydrogenation of the nickel oxide electrode prior to forming the protective layer of electrically conductive metal oxide thereon.

Figure 5:
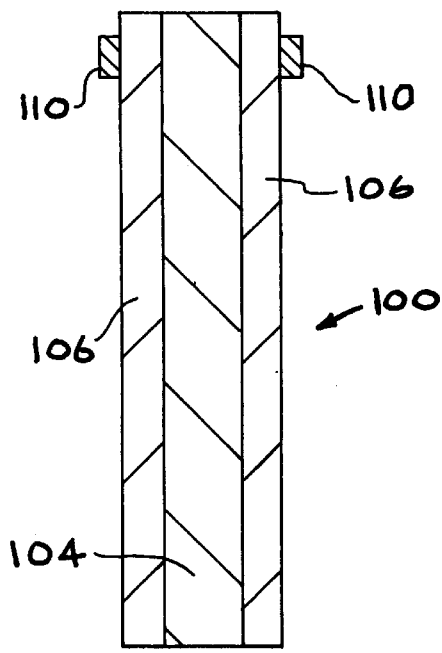
FIG. 5 is a vertical cross-sectional view of another embodiment of the invention.

Turning now to FIG. 5, another embodiment of the invention is shown wherein a film 106 of electrically conductive titanium suboxide coating is formed by low temperature cathodic arc deposition over a substrate or core 104 which may comprise an electrically conductive material, e.g., a metal rod, thereby forming a composite electrode generally indicated at arrow 100. When substrate 104 is an electrically conductive material, it may act as the current collector for electrode 100. Such an electrode, for example, could find particular utility whenever it is desirable to provide an electrode with a chemically inert or non-reactive surface thereon, such as an electrode in contact with the earth.

Electrode 100 may also be formed with a non-electrically conductive core, i.e., a non-metallic core, to avoid any possibility of exposure of a metal core to the external environment. In such instance, a collar of an electrically conductive material, such as illustrated metal collar 110, may be formed or bonded to the external surface of electrode 100, as shown in FIG. 5.

Thus, the invention provides a low temperature method for forming a metal suboxide coating on a substrate. In the preferred embodiment comprising the formation of an electrically conductive titanium suboxide coating on an electrode of a rechargeable cell, such as a nickel oxide electrode, the low temperature formation of an electrically conductive metal oxide coating on the electrode surface enhances the performance of the electrode by lowering the rate of parasitic evolution of oxygen during charging of the electrode and overcharging of the cell.

Having thus described the invention what is claimed is:

1. A low temperature process for forming a metal suboxide on a substrate surface in a deposition chamber which comprises forming said metal suboxide on the surface of said substrate by cathodic arc deposition while controlling at least one of:
   a) the partial pressure of the oxygen present in the deposition chamber; and
   b) the density of the metal flux.

2. The process of claim 1 which further comprises providing a negative bias on said substrate with respect to at least one of the electrodes used to form said cathodic arc.

3. The process of claim 1 which further comprises carrying out said process at a temperature ranging from about 0° C. to about 100° C.

4. A low temperature process for forming an improved electrode having a generally chemically non-reactive but electrically conductive film formed on the surface thereof which comprises forming on the surface of said electrode an electrically conductive metal suboxide by cathodic arc deposition in a deposition chamber while controlling the oxygen partial pressure of an oxygen-containing gas in said chamber.

5. A low temperature process for forming an improved electrode for a rechargeable cell capable of suppressing evolution of gas at the electrode surface which comprises forming on the surface of said electrode an electrically conductive metal suboxide by cathodic arc deposition in a deposition chamber while controlling the oxygen partial pressure of an oxygen-containing gas in said chamber.

6. The process of claim 5 wherein said partial pressure of oxygen in said deposition chamber ranges from about 1 Pascal to about 3 Pascals.

7. The process of claim 5 wherein the temperature of said electrode surface during the deposition ranges from about 0° C. to about 100° C.

8. The process of claim 7 wherein said electrode comprises a positive electrode.

9. The process of claim 7 wherein said positive electrode comprises an electrode containing nickel oxide.

10. The process of claim 9 wherein said positive nickel oxide-containing electrode has a nickel oxide surface below said conductive metal oxide formed thereon.

11. The process of claim 7 wherein said conductive metal oxide formed on said positive electrode comprises a suboxide of titanium.

12. The process of claim 11 wherein said suboxide of titanium has the formula $TiO_x$, where x ranges from at least 1.6 to about 1.9.

13. The process of claim 11 wherein said suboxide of titanium has the formula $TiO_x$, where x ranges from at least 1.7 to about 1.8.

14. A low temperature process for forming an improved nickel oxide electrode for a rechargeable cell characterized by a reduced rate of parasitic evolution of oxygen during charging and reduced evolution of oxygen during overcharging of the cell which comprises:
   a) forming a plasma of titanium ions between an anode and a titanium cathode in a deposition chamber;
   b) maintaining in said chamber during said formation of said plasma, a partial pressure of oxygen, sufficient, relative to the density of the titanium ion flux in said plasma, to form on a surface of a nickel oxide electrode in said chamber, an electrically conductive titanium suboxide.

15. The process of claim 14 wherein said conductive titanium suboxide has the formula $TiO_x$, where x ranges from at least 1.6 to about 1.9.

16. The process of claim 14 wherein said conductive titanium suboxide has the formula $TiO_x$, where x ranges from at least 1.7 to about 1.8.

17. The process of claim 14 wherein the temperature of said nickel oxide electrode in said deposition chamber is maintained with a range of from about 0° C. and about 100° C.

18. The process of claim 14 wherein the temperature of said nickel oxide electrode in said deposition chamber is maintained with a range of from about 20° C. and about 100° C.

19. The process of claim 14 wherein the partial pressure of oxygen in said deposition chamber ranges from about 1 Pascal to about 3 Pascals.

* * * * *